United States Patent
Takase

(10) Patent No.: US 12,377,440 B2
(45) Date of Patent: Aug. 5, 2025

(54) ULTRASONIC SENSOR WITH REVERBERANT VIBRATION SUPPRESSION CIRCUIT

(71) Applicant: Murata Manufacturing Co., Ltd., Nagaokakyo (JP)

(72) Inventor: Yasuhide Takase, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1031 days.

(21) Appl. No.: 17/130,341

(22) Filed: Dec. 22, 2020

(65) Prior Publication Data

US 2021/0107030 A1 Apr. 15, 2021

Related U.S. Application Data

(63) Continuation of application No. PCT/JP2019/024172, filed on Jun. 18, 2019.

(30) Foreign Application Priority Data

Jul. 6, 2018 (JP) .................................. 2018-129396

(51) Int. Cl.
  *B06B 1/02* (2006.01)
  *G01S 7/521* (2006.01)
  (Continued)

(52) U.S. Cl.
  CPC ............ *B06B 1/0215* (2013.01); *G01S 7/521* (2013.01); *G01S 7/524* (2013.01); *B06B 2201/30* (2013.01);
  (Continued)

(58) Field of Classification Search
  CPC .. H10N 30/20; B06B 1/0215; B06B 2201/30; B06B 2201/55; G01S 7/521; G01S 7/524; G01S 15/931
  (Continued)

(56) References Cited

U.S. PATENT DOCUMENTS

| 6,169,765 B1* | 1/2001 | Holcombe ........... H03K 5/1565 |
| | | 329/312 |
| 2002/0003384 A1* | 1/2002 | Iino ....................... H02N 2/166 |
| | | 310/316.02 |

(Continued)

FOREIGN PATENT DOCUMENTS

| JP | 03-282386 A | 12/1991 |
| JP | 2012-065308 A | 3/2012 |

(Continued)

OTHER PUBLICATIONS

Official Communication issued in International Patent Application No. PCT/JP2019/024172, mailed on Sep. 3, 2019.

*Primary Examiner* — Emily P Pham
*Assistant Examiner* — Monica Mata
(74) *Attorney, Agent, or Firm* — Keating & Bennett, LLP

(57) ABSTRACT

An ultrasonic sensor is provided in which, after output of an excitation signal from a transmission circuit to a drive electrode is stopped, when a suppression control signal subjected to signal amplification by a band variable calculation amplifier is supplied from a reverberant vibration suppression circuit to the drive electrode, reverberant vibration of a piezoelectric body is reduced or prevented in a reverberation suppression time period. In a reception time period after output of the suppression control signal to the drive electrode is stopped, a signal amplification frequency band of the band variable calculation amplifier is varied by a control circuit, and a signal amplification factor of the band variable calculation amplifier in a frequency band of high-frequency noise that occurs within the band variable calculation amplifier is reduced.

8 Claims, 6 Drawing Sheets

(51) Int. Cl.
    *G01S 7/524* (2006.01)
    *G01S 15/931* (2020.01)
    *H10N 30/20* (2023.01)

(52) U.S. Cl.
    CPC ......... *B06B 2201/55* (2013.01); *G01S 15/931* (2013.01); *H10N 30/20* (2023.02)

(58) Field of Classification Search
    USPC .......................................................... 310/317
    See application file for complete search history.

(56) References Cited

U.S. PATENT DOCUMENTS

| | | |
|---|---|---|
| 2012/0068574 A1 | 3/2012 | Wu et al. |
| 2013/0049823 A1* | 2/2013 | Iwasaki .......... H03K 19/018571 327/124 |
| 2015/0292879 A1* | 10/2015 | Zhou ....................... G01S 7/527 73/629 |
| 2017/0324377 A1* | 11/2017 | Pereira Da Silva, Jr. .................. H03K 5/24 |
| 2018/0021814 A1 | 1/2018 | Watanabe et al. |
| 2019/0107611 A1 | 4/2019 | Matsuura et al. |

FOREIGN PATENT DOCUMENTS

| | | |
|---|---|---|
| JP | 2015-190817 A | 11/2015 |
| JP | 2017-172989 A | 9/2017 |
| JP | 6249111 B2 | 12/2017 |
| WO | 2016/167003 A1 | 10/2016 |

\* cited by examiner

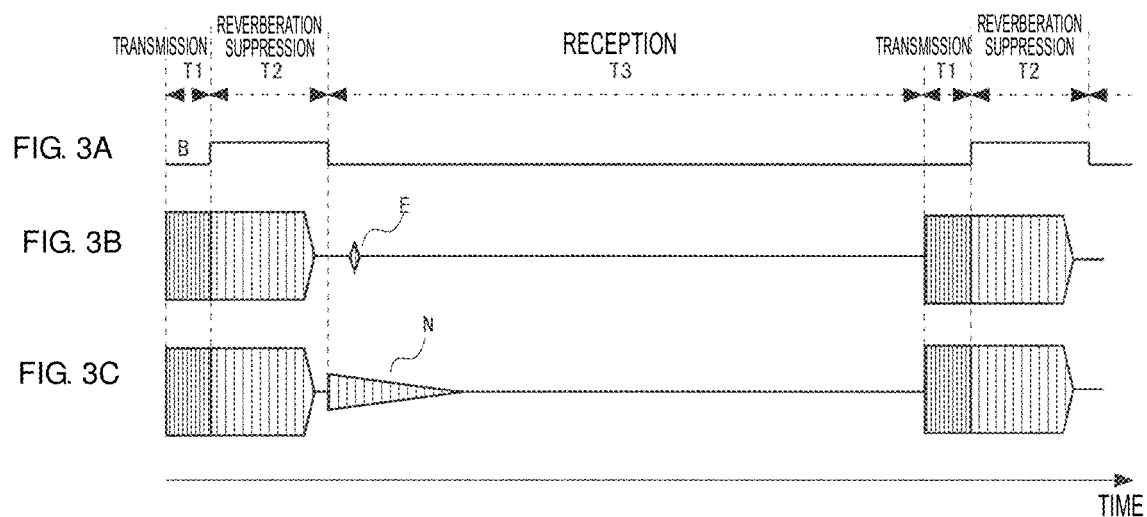
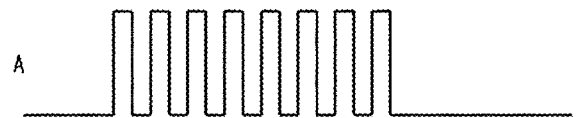
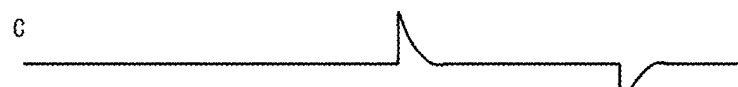

ULTRASONIC SENSOR WITH REVERBERANT VIBRATION SUPPRESSION CIRCUIT

CROSS REFERENCE TO RELATED APPLICATIONS

This application claims the benefit of priority to Japanese Patent Application No. 2018-129396 filed on Jul. 6, 2018 and is a Continuation Application of PCT Application No. PCT/JP2019/024172 filed on Jun. 18, 2019. The entire contents of each application are hereby incorporated herein by reference.

BACKGROUND OF THE INVENTION

1. Field of the Invention

The present invention relates to an ultrasonic sensor including a reverberant vibration suppression circuit that reduces or prevents reverberant vibration of an oscillator body that emits an ultrasonic wave.

2. Description of the Related Art

In the related art, an example of this type of ultrasonic sensor is disclosed in Japanese Patent No. 6249111. This ultrasonic sensor includes a semiconductor switch, and an electrical path between a transmission electrode and a reception electrode that are included in a piezoelectric body that emits an ultrasonic wave that is switched between conductive and non-conductive states by the semiconductor switch. After applying an alternating-current voltage to the transmission electrode is stopped, when the above-described path is put into a conductive state by the semiconductor switch, a reverberant signal output from a reception region in the piezoelectric body in accordance with reverberant vibration of the piezoelectric body is fed back to the transmission electrode. When the reverberant signal is fed back as a voltage to the transmission electrode, the reverberant vibration of the piezoelectric body is cancelled out and suppressed. After the reverberant signal is fed back to the transmission electrode, when the above-described path is switched from the conductive state to a non-conductive state, the ultrasonic sensor is put into a state enabling reception.

In the above-described existing ultrasonic sensor, however, even when the reverberant signal is fed back as a voltage to the transmission electrode and the reverberant vibration of a piezoelectric element is temporarily suppressed, the piezoelectric body is excited again by high-frequency noise caused, for example, by switching of the semiconductor switch and vibrates again. For this reason, even if the semiconductor switch is switched from the conductive state to the non-conductive state to put the ultrasonic sensor into the state enabling reception, a reception signal to be received immediately after the reverberant vibration of a vibrating body is suppressed is buried in noise caused by this re-vibration, and the reception signal is not able to be received properly.

SUMMARY OF THE INVENTION

Preferred embodiments of the present invention provide ultrasonic sensors that each reduce or prevent reverberant vibration of an oscillator body that emits an ultrasonic wave.

An ultrasonic sensor according to a preferred embodiment of the present invention includes an oscillator including a drive electrode to which an excitation signal that causes a vibrating body to vibrate is applied and a detection electrode that extracts a detection signal corresponding to vibration of the vibrating body, and being configured to emit an ultrasonic wave; a transmission circuit configured to output the excitation signal that causes the vibrating body to vibrate to the drive electrode; a reception circuit configured to receive the detection signal detected by the detection electrode; a reverberant vibration suppression circuit configured to, after output of the excitation signal from the transmission circuit to the drive electrode is stopped, amplify a reverberant vibration suppression circuit control signal corresponding to reverberant vibration of the vibrating body output from the reception circuit to generate and supply a suppression control signal that reduces or prevents the reverberant vibration to the drive electrode, and including a band variable calculation amplifier whose frequency band of signal amplification is variable; and a control circuit configured to, after output of the suppression control signal from the reverberant vibration suppression circuit to the drive electrode is stopped, vary the frequency band of signal amplification of the band variable calculation amplifier.

In this configuration, after output of the excitation signal from the transmission circuit to the drive electrode is stopped, when the suppression control signal subjected to signal amplification by the band variable calculation amplifier is supplied from the reverberant vibration suppression circuit to the drive electrode, reverberant vibration of the vibrating body is reduced or prevented. Furthermore, after output of the suppression control signal to the drive electrode is stopped, the signal amplification frequency band of the band variable calculation amplifier is varied by the control circuit, a signal amplification factor of the band variable calculation amplifier in a frequency band of high-frequency noise that occurs within the band variable calculation amplifier is reduced, and thus a signal level of high-frequency noise to be applied to the drive electrode after the reverberant vibration of the vibrating body is reduced or prevented is reduced. Thus, after the reverberant vibration of the vibrating body is reduced or prevented, the vibrating body is kept from being excited again due to high-frequency noise and vibrating again. This enables reception immediately after the reverberant vibration of the vibrating body is reduced or prevented.

Thus, preferred embodiments of the present invention are able to provide ultrasonic sensors that are each able to properly receive a reception signal to be received immediately after the reverberant vibration of the vibrating body is reduced or prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 3A to 3C illustrate an operation sequence of the ultrasonic sensor.

FIGS. 4A to 4D illustrate signal waveforms at respective locations in the ultrasonic sensor illustrated in FIG. 1.

DETAILED DESCRIPTION OF THE PREFERRED EMBODIMENTS

Preferred embodiments of the present invention will be described below with reference to the drawings.

Figure 1:
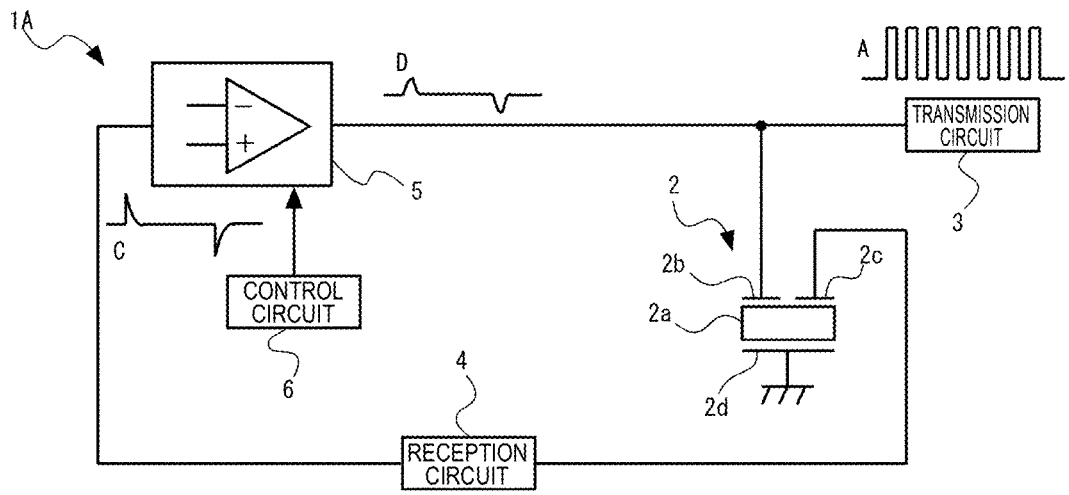
FIG. 1 is a circuit diagram of an ultrasonic sensor according to a first preferred embodiment of the present invention.

FIG. 1 is a circuit diagram of an ultrasonic sensor 1A according to a first preferred embodiment of the present invention.

The ultrasonic sensor 1A is installed, for example, in a vehicle and is used to measure a distance from itself to an object in accordance with a period of time from when an ultrasonic wave is emitted to when a reflected wave is received. The ultrasonic sensor 1A includes a piezoelectric element 2, which is an oscillator that emits an ultrasonic wave, a transmission circuit 3, a reception circuit 4, a reverberant vibration suppression circuit 5, and a control circuit 6. The piezoelectric element 2 includes a piezoelectric body 2a, which is a vibrating body, a drive electrode 2b, a detection electrode 2c, and a common electrode 2d. The common electrode 2d is connected to a reference voltage, such as a ground voltage, for example. An excitation signal that causes the piezoelectric body 2a to vibrate is applied between the drive electrode 2b and the common electrode 2d. Furthermore, electric charge corresponding to vibration of the piezoelectric body 2a occurs between the detection electrode 2c and the common electrode 2d, and this electric charge is extracted as a detection signal. The transmission circuit 3 outputs an excitation signal A that causes the piezoelectric body 2a to vibrate to the drive electrode 2b. The reception circuit 4 receives a detection signal detected by the detection electrode 2c through vibration of the piezoelectric body 2a due to reception of a reflected wave or the like.

When the excitation signal A is applied to the drive electrode 2b, the piezoelectric body 2a vibrates, and an ultrasonic wave is emitted into the air. After output of the excitation signal A from the transmission circuit 3 to the drive electrode 2b is stopped, the vibration of the piezoelectric body 2a does not subside quickly, and the vibration remains as reverberant vibration for a period of time. Due to the reverberant vibration, a voltage corresponding to the reverberant vibration is detected as a reverberant signal at the detection electrode 2c. The reverberant signal is input from the detection electrode 2c to the reception circuit 4, and the reception circuit 4 outputs, to the reverberant vibration suppression circuit 5, a reverberant vibration suppression circuit control signal that controls the reverberant vibration suppression circuit 5 in accordance with the input reverberant signal.

The reverberant vibration suppression circuit 5 includes a band variable calculation amplifier 50. The reverberant vibration suppression circuit 5 amplifies the reverberant vibration suppression circuit control signal output from the reception circuit 4 after output of the excitation signal A from the transmission circuit 3 to the drive electrode 2b is stopped to generate and supply a suppression control signal that reduces or prevents the reverberant vibration to the drive electrode 2b. The suppression control signal is generated, for example, as a voltage signal having a phase inverted with respect to that of the reverberant signal so that the vibration of the piezoelectric body 2a due to the reverberant vibration is cancelled out.

Figure 2A:
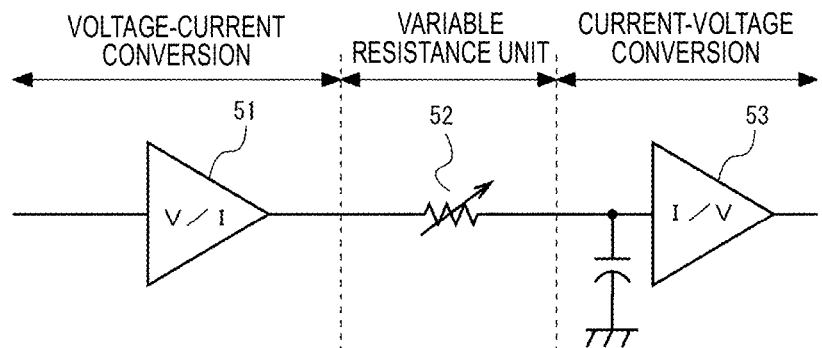
FIGS. 2A and 2B illustrate circuit diagrams illustrating an internal configuration of a band variable calculation amplifier of the ultrasonic sensor illustrated in FIG. 1.
Figure 2B:
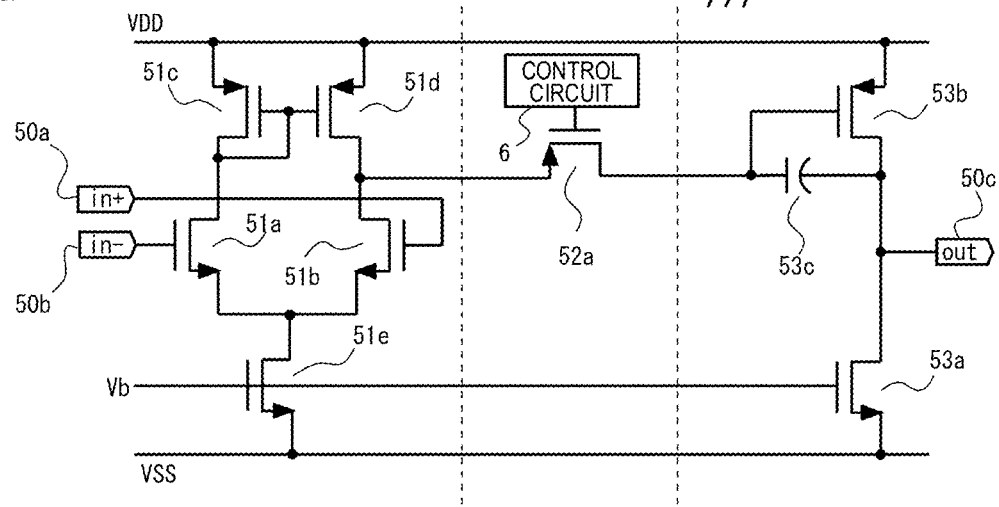

The band variable calculation amplifier 50 has an internal configuration illustrated in FIGS. 2A and 2B in which a frequency band of signal amplification is variable, FIG. 2A illustrates a schematic configuration, and FIG. 2B illustrates an example of a detailed configuration. In other words, the band variable calculation amplifier 50 includes a voltage-current conversion circuit 51 in an input stage, a variable resistance circuit 52 in an intermediate stage, and a current-voltage conversion circuit 53 in an output stage. The voltage-current conversion circuit 51 includes a pair of MOSFETs (MOS field-effect transistors) 51a and 51b including gates to which input voltages of a non-inverting input terminal (+) 50a and an inverting input terminal (−) 50b of the band variable calculation amplifier 50 are applied, a pair of MOSFETs 51c and 51d defining a current mirror circuit, and a MOSFET 51e including a gate to which a constant voltage Vb is supplied to define and function as a constant current source. The voltage-current conversion circuit 51 converts a differential voltage input between the non-inverting input terminal (+) 50a and the inverting input terminal (−) 50b to a current. The current-voltage conversion circuit 53 includes a MOSFET 53a including a gate to which the constant voltage Vb is supplied to define and function as the constant current source, and a MOSFET 53b connected in series with the MOSFET 53a and including a gate and a drain between which a capacitor 53c is connected. The current-voltage conversion circuit 53 converts the current subjected to conversion by the voltage-current conversion circuit 51 to a voltage and outputs the voltage to an output terminal 50c of the band variable calculation amplifier 50. The internal circuit illustrated in FIG. 2B is one example, and the configuration of the voltage-current conversion circuit 51 and the current-voltage conversion circuit 53 is not limited to this.

The variable resistance circuit 52 provided between the voltage-current conversion circuit 51 and the current-voltage conversion circuit 53 includes a MOSFET 52a including a gate to which the control circuit 6 is connected, and a resistance value is varied by the control circuit 6. After output of the suppression control signal from the reverberant vibration suppression circuit 5 to the drive electrode 2b is stopped, the control circuit 6 controls the resistance value of the variable resistance circuit 52 to thereby vary a frequency band of signal amplification of the band variable calculation amplifier 50. In the present preferred embodiment, a dominant pole is provided in the band variable calculation amplifier 50 by resistance of the variable resistance circuit 52 and capacitance provided in a circuit around the variable resistance circuit 52. The control circuit 6 controls the resistance value of the variable resistance circuit 52 to vary a frequency band of signal amplification performed by the band variable calculation amplifier 50.

Although, in the band variable calculation amplifier 50, high-frequency noise occurs due to switching of each MOSFET, the ultrasonic sensor 1A according to the present preferred embodiment changes a frequency of the dominant pole to reduce the high-frequency noise that occurs after the vibration of the piezoelectric body 2a due to reverberant vibration is cancelled out by the suppression control signal.

To vary the signal amplification frequency band of the band variable calculation amplifier 50, typically, a current value of a current caused to flow by the MOSFETs 51e and 53a defining the constant current source is reduced. However, when the current value is reduced, voltages at nodes of the band variable calculation amplifier 50 change, a bias voltage to each MOSFET changes, and an output DC voltage of the band variable calculation amplifier 50 changes slightly. On the other hand, in the present preferred embodiment in which the frequency band of signal amplification performed by the band variable calculation amplifier 50 is varied by changing the frequency of the dominant pole as described above, the voltages at the nodes do not change, thus exerting no influence on an output of the band variable calculation amplifier 50.

FIGS. 3A to 3C illustrate an operation sequence of the ultrasonic sensor 1A, and time elapses from left to right in FIGS. 3A to 3C. The ultrasonic sensor 1A repeats a transmission operation in a time period T1, a reverberation suppression operation in a time period T2, and a reception operation in a time period T3. FIG. 3A is a timing chart of a suppression control signal B output from the reverberant vibration suppression circuit 5 to the drive electrode 2b. FIG. 3B illustrates an operation sequence of the ultrasonic sensor 1A at the time when no re-excitation of the piezoelectric body 2a occurs after the vibration of the piezoelectric body 2a due to reverberant vibration is reduced or prevented. FIG. 3C illustrates an operation sequence of the ultrasonic sensor 1A at the time when re-excitation of the piezoelectric body 2a occurs after the vibration of the piezoelectric body 2a due to reverberant vibration is reduced or prevented.

In the transmission time period T1, the excitation signal A (see FIG. 4A) from the transmission circuit 3 to the drive electrode 2b is output, and the piezoelectric body 2a is caused to vibrate to generate an ultrasonic wave. In the reverberation suppression time period T2 after output of the excitation signal A from the transmission circuit 3 to the drive electrode 2b is stopped, the suppression control signal B (see FIG. 4B) is activated. The generated suppression control signal B is applied to the drive electrode 2b, and reverberant vibration of the piezoelectric body 2a is reduced or prevented. The suppression control signal B is a pulsed signal, and high-frequency noise C (see FIG. 4C) occurs at timings of a rising edge and a falling edge of the signal. The high-frequency noise C turns into high-frequency noise D (see FIG. 4D) that has been subjected to attenuation by the band variable calculation amplifier 50.

Figure 5A:
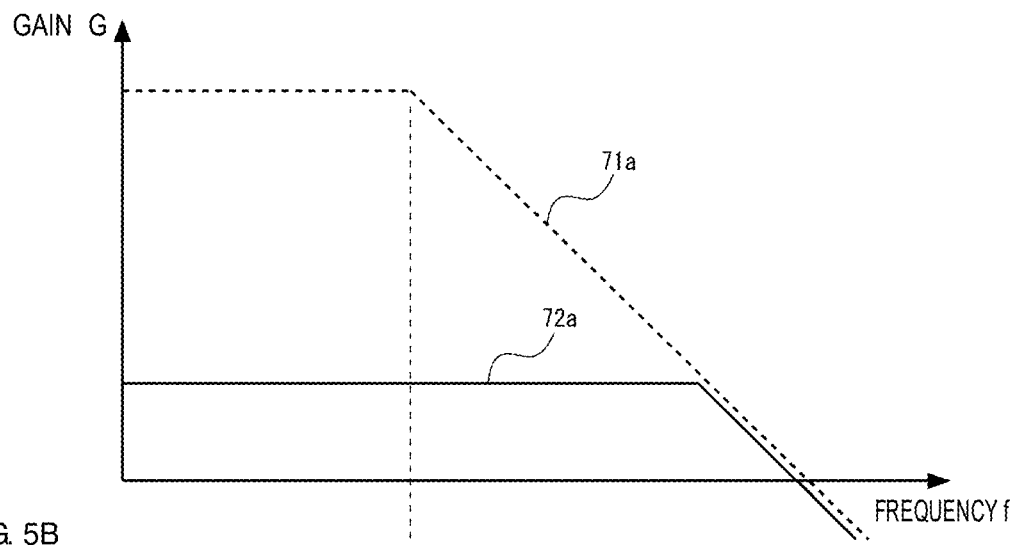
FIGS. 5A and 5B include graphs illustrating gain characteristics around the time when a signal amplification frequency band of a low pass filter provided in the ultrasonic sensor illustrated in FIG. 1 is varied.
Figure 5B:
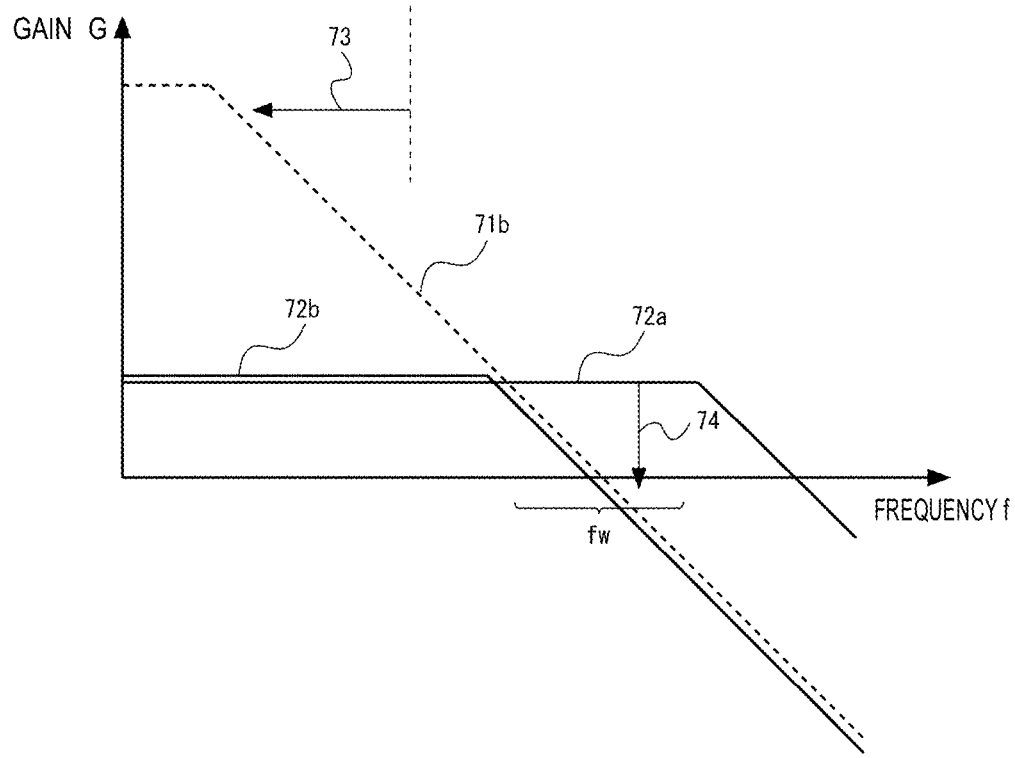

FIG. 5A is a graph illustrating an open-loop gain characteristic and a closed-loop gain characteristic of the band variable calculation amplifier 50 at a time prior to the time when the frequency of the dominant pole of the band variable calculation amplifier 50, that is, a cutoff frequency of a low pass filter whose cutoff frequency is the lowest provided in the band variable calculation amplifier 50 is reduced. FIG. 5B is a graph illustrating an open-loop gain characteristic and a closed-loop gain characteristic of the band variable calculation amplifier 50 at the time when the cutoff frequency is reduced. In each graph, the horizontal axis represents signal frequency f, and the vertical axis represents gain G of the band variable calculation amplifier 50. Furthermore, in FIG. 5A, a characteristic line 71a indicated by a dotted line represents an open-loop gain characteristic of the band variable calculation amplifier 50 at a time prior to the time when the cutoff frequency is reduced, and a characteristic line 72a indicated by a solid line represents a closed-loop gain characteristic. Furthermore, in FIG. 5B, a characteristic line 71b indicated by a dotted line represents an open-loop gain characteristic of the band variable calculation amplifier 50 at the time when the cutoff frequency is reduced, and a characteristic line 72b indicated by a solid line represents a closed-loop gain characteristic.

Figure 6:
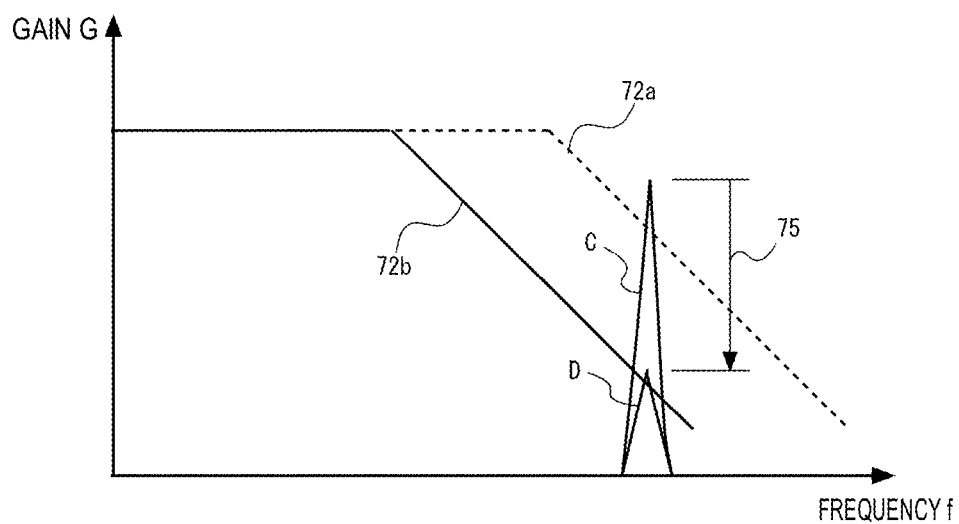
FIG. 6 is a graph illustrating that high-frequency noise is reduced by the low pass filter provided in the ultrasonic sensor illustrated in FIG. 1.

When the cutoff frequency is reduced as indicated by an arrow 73, in the open-loop gain characteristic and the closed-loop gain characteristic of the band variable calculation amplifier 50, the gain G in a frequency band fw in which high-frequency noise occurs decreases as indicated by an arrow 74, and a signal amplification factor of the band variable calculation amplifier 50 decreases. Thus, as indicated by a graph illustrated in FIG. 6, of the band variable calculation amplifier 50 at a time prior to the time when the cutoff frequency is reduced, in the closed-loop gain characteristic represented by the characteristic line 72a indicated by a dotted line, the high-frequency noise C is subjected to signal amplification. However, of the band variable calculation amplifier 50 at the time when the cutoff frequency is reduced, in the closed-loop gain characteristic represented by the characteristic line 72b indicated by a solid line, the signal amplification factor is small, and the high-frequency noise C is reduced to the high-frequency noise D whose amplitude has been attenuated as indicated by an arrow 75. The vertical and horizontal axes of the graph illustrated in FIG. 6 are the same as those of each graph included in FIGS. 5A and 5B.

Thus, in the reception time period T3 of the operation sequence illustrated in FIG. 3B, after the reverberant vibration of the piezoelectric body 2a is reduced or prevented, the high-frequency noise C is reduced to the high-frequency noise D, and thus no re-excitation of the piezoelectric body 2a occurs. For this reason, in the reception time period T3 immediately after the reverberation suppression time period T2 ends, vibration of the piezoelectric body 2a caused when a reflected wave of the ultrasonic wave is received can be captured as a detection wave E at the detection electrode 2c. However, in the reception time period T3 of the operation sequence illustrated in FIG. 3C, after the reverberant vibration of the piezoelectric body 2a is reduced or prevented, when the high-frequency noise C is output from the band variable calculation amplifier 50 to the drive electrode 2b, re-excitation of the piezoelectric body 2a occurs. Thus, in the reception time period T3 immediately after the reverberation suppression time period T2 ends, noise N is caused by vibration due to the re-excitation of the piezoelectric body 2a. For this reason, when a reflected wave is received in the reception time period T3 immediately after the reverberation suppression time period T2 ends, the reflected wave is buried in the noise N and is not able to be detected. As a result, the ultrasonic sensor 1A is not able to detect an object at a short distance.

Figure 7:
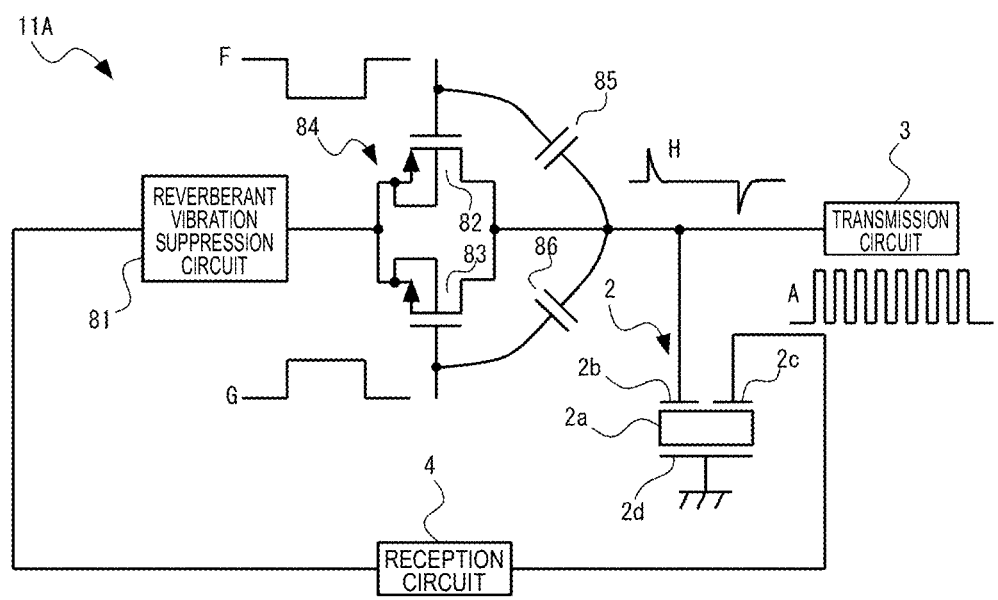
FIG. 7 is a circuit diagram of an ultrasonic sensor according to a first comparative example compared with the ultrasonic sensor illustrated in FIG. 1.

As described above, through switching from the reverberation suppression time period T2 to the reception time period T3, the high-frequency noise C occurs due to a falling edge of the suppression control signal B, and the high-frequency noise C causes re-excitation of the piezoelectric body 2a. The re-excitation of the piezoelectric body 2a due to such high-frequency noise also occurs in an ultrasonic sensor 11A illustrated in FIG. 7 as a first comparative example. In FIG. 7, elements or portions that are the same as or correspond to those in FIG. 1 are denoted by the same reference signs, and a description thereof is omitted.

The ultrasonic sensor 11A includes a reverberant vibration suppression circuit 81 including an amplifier circuit, a filter, and so forth, and a control signal output from the reception circuit 4 is amplified by the reverberant vibration suppression circuit 81. The amplified control signal is subjected to switching by a transmission gate 84 including an n-channel MOSFET 82 and a p-channel MOSFET 83 to be converted to a suppression control signal, and the suppression control signal is supplied to the drive electrode 2b in the reverberation suppression time period T2. At this time, a drive pulse F that swings to a negative voltage is supplied to a gate of the n-channel MOSFET 82, and a drive pulse G, which is an inverted drive pulse F, that swings to a positive voltage is supplied to a gate of the p-channel MOSFET 83. A drive voltage of the piezoelectric element 2 is high, e.g., several tens of volts, the voltage of the suppression control signal that reduces or prevents reverberant vibration of the piezoelectric body 2a also has to be high, and the element size of the transmission gate 84 increases to also result in an increase in the amplitude of each of the drive pulses F and G. Furthermore, parasitic capacitance 85 and parasitic capacitance 86 are generated between respective gates and drains of the MOSFETs 82 and 83. Capacitance values of the parasitic capacitance 85 and the parasitic capacitance 86 also increase as the element size of the transmission gate 84 increases. Thus, at timings of a rising edge and a falling edge of the suppression control signal supplied to the drive electrode 2b, high-frequency noise H whose amplitude is large occurs. For this reason, at the time of switching from the reverberation suppression time period T2 to the reception time period T3, the piezoelectric body 2a is excited again by the high-frequency noise H that occurs at the falling edge of the suppression control signal.

Figure 8:
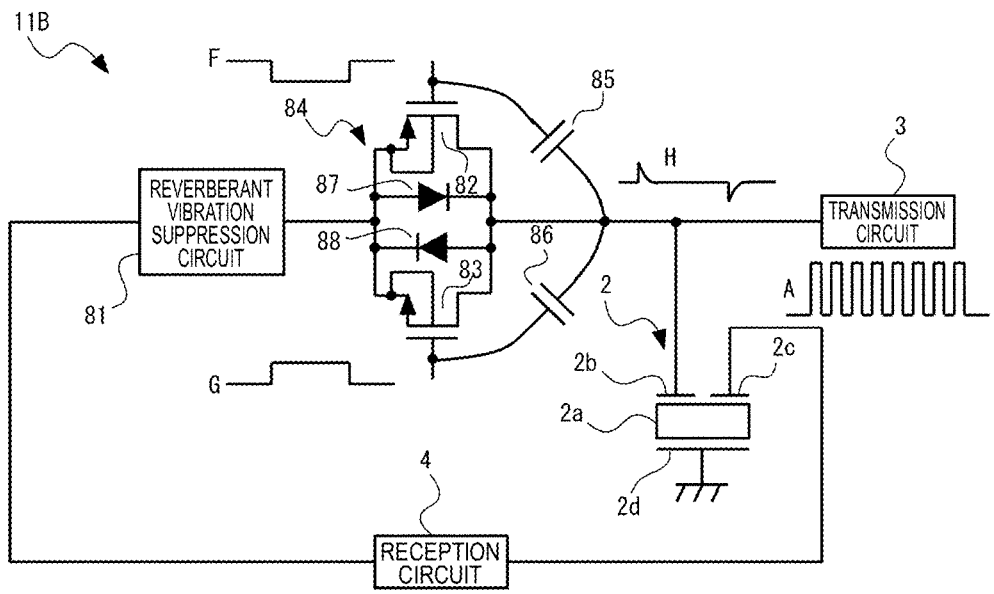
FIG. 8 is a circuit diagram of an ultrasonic sensor according to a second comparative example compared with the ultrasonic sensor illustrated in FIG. 1.

Furthermore, the re-excitation of the piezoelectric body 2a due to high-frequency noise also occurs in an ultrasonic sensor 11B illustrated in FIG. 8 as a second comparative example. In FIG. 8, elements or portions that are the same as or correspond to those in FIG. 7 are denoted by the same reference signs, and a description thereof is omitted.

In the ultrasonic sensor 11B, the transmission gate 84 whose element size is small is used, and the amplitude of each of the drive pulses F and G supplied to the respective gates of the MOSFETs 82 and 83 is small. Furthermore, the parasitic capacitance and the parasitic capacitance 86 generated between the respective gates and drains of the MOSFETs 82 and 83 are also small in accordance with the element size of the transmission gate 84. For this reason, the high-frequency noise H that occurs at timings of a rising edge and a falling edge of the suppression control signal supplied to the drive electrode 2b is small in amplitude. However, parasitic diodes 87 and 88 are provided between respective sources and drains of the MOSFETs 82 and 83, the control signal is amplified at a large magnification by the reverberant vibration suppression circuit 81, and thus the voltage of the high-frequency noise H exceeds forward voltages of the parasitic diodes 87 and 88. For this reason, at the time of switching from the reverberation suppression time period T2 to the reception time period T3, a signal that passes through the parasitic diodes 87 and 88 to excite the piezoelectric body 2a is output to the drive electrode 2b, and the piezoelectric body 2a is excited again.

In the ultrasonic sensor 1A according to the present preferred embodiment, however, as described above, the high-frequency noise C that occurs at the time of switching from the reverberation suppression time period T2 to the reception time period T3 is attenuated by lowering the band of the band variable calculation amplifier 50, the parasitic diodes 87 and 88 are therefore not put into a conductive state, and thus no re-excitation of the piezoelectric body 2a occurs.

Thus, in the ultrasonic sensor 1A according to the present preferred embodiment, after output of the excitation signal A from the transmission circuit 3 to the drive electrode 2b is stopped, when the suppression control signal B subjected to signal amplification by the band variable calculation amplifier 50 is supplied from the reverberant vibration suppression circuit 5 to the drive electrode 2b, reverberant vibration of the piezoelectric body 2a is reduced or prevented in the reverberation suppression time period T2. Furthermore, in the reception time period T3 after output of the suppression control signal B to the drive electrode 2b is stopped, the signal amplification frequency band of the band variable calculation amplifier 50 is varied by the control circuit 6, a signal amplification factor of the band variable calculation amplifier 50 in a frequency band of the high-frequency noise C that occurs within the band variable calculation amplifier 50 is reduced, and thus a signal level of the high-frequency noise D to be applied to the drive electrode 2b after the reverberant vibration of the piezoelectric body 2a is reduced or prevented is reduced.

In the present preferred embodiment, with respect to the signal amplification frequency band of the band variable calculation amplifier 50, the frequency of the dominant pole provided in the band variable calculation amplifier 50 is varied by the control circuit 6, the frequency of the dominant pole is reduced, and the signal amplification factor of the band variable calculation amplifier 50 in the frequency band of the high-frequency noise C is reduced. In other words, after output of the suppression control signal B to the drive electrode 2b is stopped, when the resistance value of the variable resistance circuit 52 is varied by the control circuit 6, a time constant of the low pass filter defined by a capacitance component and the variable resistance circuit 52 in the band variable calculation amplifier 50 changes, the signal amplification frequency band of the band variable calculation amplifier 50 is varied by using a simple circuit configuration, and the signal amplification factor of the band variable calculation amplifier 50 in the frequency band of the high-frequency noise C is reduced.

Thus, after the reverberant vibration of the piezoelectric body 2a is reduced or prevented, the high-frequency noise C is reduced by the band variable calculation amplifier 50 to the high-frequency noise D of a signal level that does not cause the piezoelectric body 2a to vibrate again. Thus, after the reverberant vibration of the piezoelectric body 2a is reduced or prevented, the piezoelectric body 2a is kept from being excited again due to the high-frequency noise D and vibrating again. For this reason, a reception signal to be received in the reception time period T3 immediately after the reverberant vibration of the piezoelectric body 2a is reduced or prevented is not buried in the noise N caused by the re-vibration of the piezoelectric body 2a, and the reception signal can be received properly.

Furthermore, in the ultrasonic sensor 1A according to the present preferred embodiment, when the variable resistance circuit 52 is defined by a MOSFET as in the voltage-current conversion circuit 51 and the current-voltage conversion circuit 53, the band variable calculation amplifier 50 is readily fabricated and is reduced in size, and the ultrasonic sensor 1A is compact and is fabricated at low costs.

Figure 9:
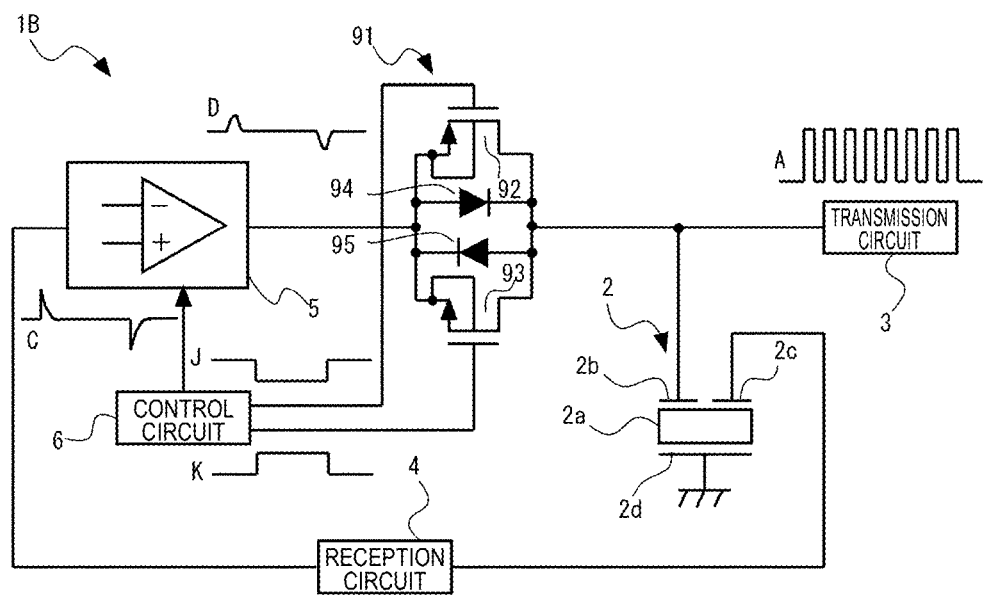
FIG. 9 is a circuit diagram of an ultrasonic sensor according to a second preferred embodiment of the present invention.

FIG. 9 is a circuit diagram of an ultrasonic sensor 1B according to a second preferred embodiment of the present invention.

The ultrasonic sensor 1B includes a semiconductor switch 91 provided between the reverberant vibration suppression circuit 5 and the drive electrode 2b. The control circuit 6 performs control so that the semiconductor switch 91 is put into a conductive state when the suppression control signal B is output from the reverberant vibration suppression circuit 5, and performs control so that the semiconductor switch 91 is put into a non-conductive state after output of the suppression control signal B from the reverberant vibration suppression circuit 5 to the drive electrode 2b is stopped. The ultrasonic sensor 1B according to the second preferred embodiment differs from the ultrasonic sensor 1A according to the first preferred embodiment in these ways. The ultrasonic sensor 1B is similar to the ultrasonic sensor 1A according to the first preferred embodiment in configurations other than these ways.

The semiconductor switch 91 includes a transmission gate in which a gap between a source and a drain of an n-channel MOSFET 92 and a gap between a source and a drain of a p-channel MOSFET 93 are connected in parallel. Between the source and drain of the MOSFET 92, a parasitic diode 94 with a forward direction from the source to the drain is provided. Between the source and drain of the MOSFET 93, a parasitic diode 95 with a forward direction from the drain to the source is provided. The MOSFET 92 is put into a conductive state when a drive pulse J is applied from the control circuit 6 to a gate, and the MOSFET 93 is put into a conductive state when a drive pulse K is applied from the control circuit 6 to a gate.

In the ultrasonic sensor 1B according to the present preferred embodiment, advantageous functions and effects similar to those in the above-described ultrasonic sensor 1A according to the first preferred embodiment are achieved. Furthermore, in the ultrasonic sensor 1B according to the present preferred embodiment, in the reception time period T3 after output of the suppression control signal B from the reverberant vibration suppression circuit 5 to the drive electrode 2b is stopped, the semiconductor switch 91 is controlled by the control circuit 6 so as to be put into the non-conductive state. At this time, the signal amplification frequency band of the band variable calculation amplifier 50 is varied by the control circuit 6. When the signal amplification factor of the band variable calculation amplifier 50 in the frequency band of the high-frequency noise C that occurs within the band variable calculation amplifier 50 is a signal amplification factor that reduces a signal level of the high-frequency noise C to not more than forward voltages of the parasitic diodes 94 and 95 parasitically residing in the semiconductor switch 91, in the reception time period T3 after the reverberant vibration of the piezoelectric body 2a is reduced or prevented, the high-frequency noise D output from the reverberant vibration suppression circuit 5 is not able to pass through the parasitic diodes 94 and 95 and is blocked by the semiconductor switch 91. Thus, in the ultrasonic sensor 1B according to the present preferred embodiment, in the reception time period T3 after the reverberant vibration of the piezoelectric body 2a is reduced or prevented, the high-frequency noise D exerts no influence on the drive electrode 2b, thus ensuring that the piezoelectric body 2a is not excited again by the high-frequency noise D and does not vibrate again.

Figure 10:
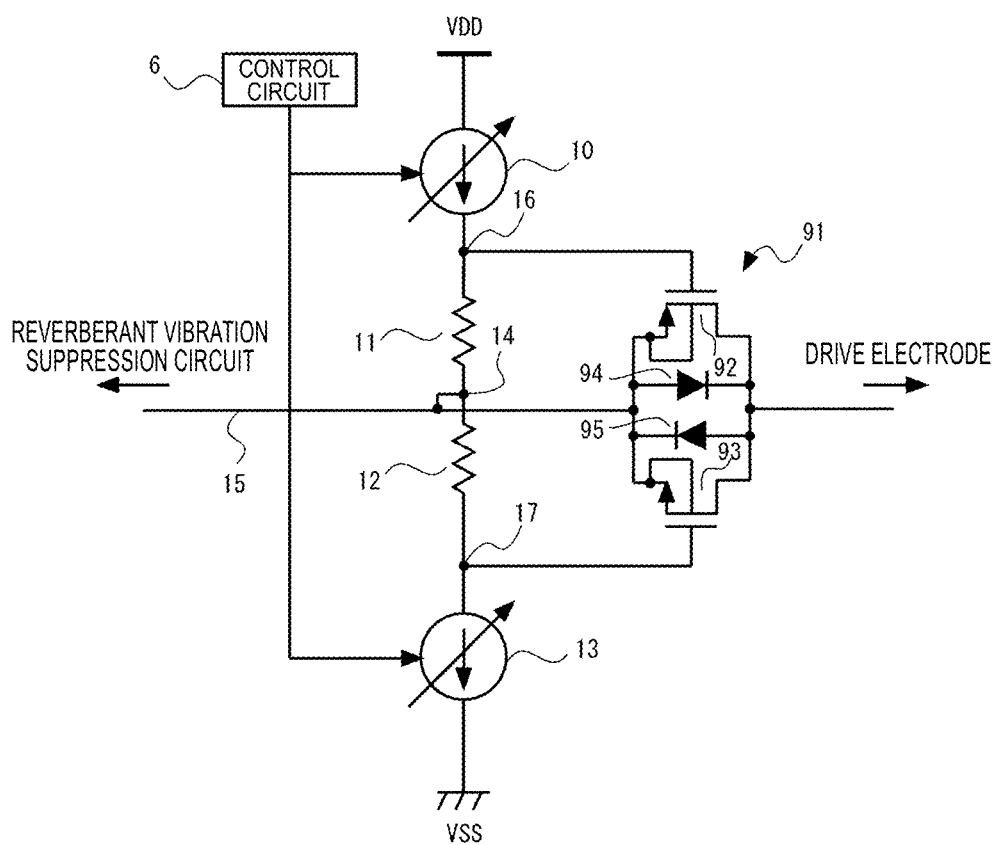
FIG. 10 is a circuit diagram of a drive circuit according to a modification of a semiconductor switch in the ultrasonic sensor illustrated in FIG. 9.

FIG. 10 is a circuit diagram illustrating a modification of a drive circuit of the semiconductor switch 91 in the ultrasonic sensor 1B illustrated in FIG. 9. In FIG. 10, elements or portions that are the same as or correspond to those in FIG. 9 are denoted by the same reference signs, and a description thereof is omitted.

The drive circuit of the semiconductor switch 91 according to the present modification includes a series circuit in which a first variable current source 10, a first resistor 11, a second resistor 12, and a second variable current source 13 are connected in series in this order between a positive power supply VDD and a negative power supply VSS and in which a connection point 14 between the first resistor 11 and the second resistor 12 is connected to an output line 15 of the reverberant vibration suppression circuit 5. The respective sources of the n-channel MOSFET 92 and the p-channel MOSFET 93 are connected to the connection point 14 between the first resistor 11 and the second resistor 12. The gate of the n-channel MOSFET 92 is connected to a connection point 16 between the first variable current source 10 and the first resistor 11, and the gate of the p-channel MOSFET 93 is connected to a connection point 17 between the second resistor 12 and the second variable current source 13.

In this configuration, a drive voltage determined by a current value of a current caused to flow through the series circuit by the first variable current source 10 and the second variable current source 13 and a resistance value of the first resistor 11 is applied between the gate and source of the n-channel MOSFET 92 in the transmission gate defining the semiconductor switch 91 with reference to a voltage at the connection point 14 between the first resistor 11 and the second resistor 12. Furthermore, a drive voltage determined by the current value of the current caused to flow through the series circuit by the first variable current source 10 and the second variable current source 13 and a resistance value of the second resistor 12 is applied between the gate and source of the p-channel MOSFET 93 with reference to the voltage at the connection point 14 between the first resistor 11 and the second resistor 12. Since the connection point 14 between the first resistor 11 and the second resistor 12 is connected to the output line 15 of the reverberant vibration suppression circuit 5, the voltage at the connection point 14 between the first resistor 11 and the second resistor 12 varies according to an output voltage of the reverberant vibration suppression circuit 5.

However, even if the output voltage of the reverberant vibration suppression circuit 5 changes, the respective drive voltages based on the output voltage of the reverberant vibration suppression circuit 5 are applied between the gate and source of the n-channel MOSFET 92 and between the gate and source of the p-channel MOSFET 93 in the transmission gate, and thus the n-channel MOSFET 92 and the p-channel MOSFET 93 are driven appropriately without being affected by a change in the output voltage of the reverberant vibration suppression circuit 5. Furthermore, each drive voltage is controlled by the control circuit 6 varying the current value of the current caused to flow through the series circuit by the first variable current source 10 and the second variable current source 13. For this reason, the semiconductor switch 91 is not affected by a change in the output voltage of the reverberant vibration suppression circuit 5, and the conductive state thereof is controlled by the control circuit 6. Thus, in the reception time period T3 after output of the suppression control signal B from the reverberant vibration suppression circuit 5 to the drive electrode 2b is stopped, the semiconductor switch 91 is controlled by the control circuit 6 so as to be put into the non-conductive state appropriately, so as to more effectively ensure that the piezoelectric body 2a is not excited again by the high-frequency noise D and does not vibrate again.

Although, in the ultrasonic sensor 1A according to the first preferred embodiment and the ultrasonic sensor 1B according to the second preferred embodiment, the case has been described where an oscillator that generates an ultrasonic wave is the piezoelectric element 2, a capacitive oscillator may be used, for example. In this case as well, advantageous functions and effects similar to those in the first and second preferred embodiments of the present invention are achieved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An ultrasonic sensor comprising:
   an oscillator including a drive electrode to which an excitation signal that causes a vibrating body to vibrate is applied and a detection electrode that extracts a detection signal corresponding to vibration of the vibrating body, and the oscillator being configured to emit an ultrasonic wave;
   a transmission circuit configured to output the excitation signal that causes the vibrating body to vibrate to the drive electrode;
   a reception circuit configured to receive the detection signal detected by the detection electrode;
   a reverberant vibration suppression circuit configured to, after the output of the excitation signal from the transmission circuit to the drive electrode is stopped, amplify a reverberant vibration suppression circuit control signal corresponding to reverberant vibration of the vibrating body output from the reception circuit to generate and supply a suppression control signal that reduces or prevents the reverberant vibration to the drive electrode, and including a band variable calculation amplifier having a variable frequency band of signal amplification without changing a gain of signal amplification in a low frequency range below a cutoff frequency compared to in a high frequency range above the cutoff frequency; and
   a control circuit configured to, after output of the suppression control signal from the reverberant vibration suppression circuit to the drive electrode is stopped, vary the variable frequency band of signal amplification of the band variable calculation amplifier.

2. The ultrasonic sensor according to claim 1, wherein the control circuit varies the variable frequency band of signal amplification by changing a frequency of a dominant pole of the band variable calculation amplifier.

3. The ultrasonic sensor according to claim 1, further comprising:
   a semiconductor switch provided between the reverberant vibration suppression circuit and the drive electrode; wherein
   the control circuit controls a conductive state of the semiconductor switch.

4. The ultrasonic sensor according to claim 1, wherein the band variable calculation amplifier includes a voltage-current conversion circuit configured to convert an input differential voltage to a current, a current-voltage conversion circuit configured to convert the current subjected to conversion by the voltage-current conversion circuit to a voltage, and a variable resistance circuit provided between the voltage-current conversion circuit and the current-voltage conversion circuit and having a resistance value that is varied by the control circuit.

5. The ultrasonic sensor according to claim 4, wherein the variable resistance circuit includes a MOSFET.

6. The ultrasonic sensor according to claim 3, further comprising:
   a series circuit including a first variable current source, a first resistor, a second resistor, and a second variable current source connected in series in this order between a positive power supply and a negative power supply and in which a connection point between the first resistor and the second resistor is connected to an output of the reverberant vibration suppression circuit; wherein
   the semiconductor switch is defined by a transmission gate including a gap between a source and a drain of an n-channel MOSFET and a gap between a source and a drain of a p-channel MOSFET that are connected in parallel, respective sources of the n-channel MOSFET and the p-channel MOSFET that are connected to the connection point between the first resistor and the second resistor, a gate of the n-channel MOSFET that is connected to a connection point between the first variable current source and the first resistor, and a gate of the p-channel MOSFET that is connected to a connection point between the second resistor and the second variable current source.

7. The ultrasonic sensor according to claim 4, wherein the voltage-current conversion circuit includes a first pair of MOSFETs including gates to which input voltages of a non-inverting input terminal and an inverting input terminal of the band variable calculation amplifier are applied, and a second pair of MOSFETs defining a current mirror circuit.

8. The ultrasonic sensor according to claim 4, wherein the current-voltage conversion circuit includes a first MOSFET including a gate to which a constant voltage is supplied to define and function as the constant current source, and a second MOSFET connected in series with the first MOSFET and including a gate and a drain between which a capacitor is connected.

* * * * *